United States Patent
Osame et al.

(10) Patent No.: US 8,212,600 B2
(45) Date of Patent: Jul. 3, 2012

(54) DATA LATCH CIRCUIT AND ELECTRONIC DEVICE

(75) Inventors: Mitsuaki Osame, Kanagawa (JP); Aya Anzai, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/213,483

(22) Filed: Aug. 19, 2011

(65) Prior Publication Data

US 2011/0304605 A1 Dec. 15, 2011

Related U.S. Application Data

(63) Continuation of application No. 11/877,730, filed on Oct. 24, 2007, now Pat. No. 8,004,334, which is a continuation of application No. 11/563,451, filed on Nov. 27, 2006, now Pat. No. 7,301,382, which is a continuation of application No. 10/724,365, filed on Dec. 1, 2003, now Pat. No. 7,142,030.

(30) Foreign Application Priority Data

Dec. 3, 2002 (JP) ................................. 2002-351672

(51) Int. Cl.
*H03K 3/12* (2006.01)
(52) U.S. Cl. ........... 327/218; 327/94; 327/208; 327/217
(58) Field of Classification Search .................... 327/91, 327/93–95, 199, 202, 203, 208, 210, 217–219
See application file for complete search history.

(56) References Cited

U.S. PATENT DOCUMENTS

| | | | |
|---|---|---|---|
| 4,237,390 A | 12/1980 | Buurma | |
| 4,547,683 A | 10/1985 | Bingham | |
| 4,560,890 A * | 12/1985 | Masuda et al. | 327/65 |
| 4,602,167 A | 7/1986 | Yukawa | |
| 4,633,222 A * | 12/1986 | Dingwall | 341/122 |
| 4,691,189 A | 9/1987 | Dingwall et al. | |
| 5,262,685 A * | 11/1993 | Demler et al. | 327/91 |
| 5,453,757 A | 9/1995 | Date et al. | |
| 5,648,791 A | 7/1997 | Date et al. | |
| 5,684,485 A | 11/1997 | Paillardet et al. | |
| 6,256,024 B1 | 7/2001 | Maekawa | |
| 6,275,210 B1 | 8/2001 | Maekawa | |

(Continued)

FOREIGN PATENT DOCUMENTS

EP 0111230 A1 6/1984

(Continued)

OTHER PUBLICATIONS

International Preliminary Examination Report from Application No. PCT/JP03/15385 mailed May 11, 2004 and partial translation.

(Continued)

*Primary Examiner* — Long Nguyen
(74) *Attorney, Agent, or Firm* — Fish & Richardson P.C.

(57) ABSTRACT

The data latch circuit of the invention includes a means for short-circuiting an input terminal and an output terminal of an inverter and by connecting the input terminal to one electrode of a capacitor and sampling a data signal or a reference potential to the other electrode of the capacitor, an accurate operation can be obtained without being influenced by variations in the TFT characteristics even when the amplitude of an input signal is small relatively to the width of a power supply voltage.

15 Claims, 10 Drawing Sheets

U.S. PATENT DOCUMENTS

| | | |
|---|---|---|
| 6,476,789 B1 | 11/2002 | Sakaguchi et al. |
| 6,628,146 B2 * | 9/2003 | Tam ................................ 327/63 |
| 6,713,324 B2 | 3/2004 | Shiba et al. |
| 6,809,706 B2 | 10/2004 | Shimoda |
| 6,870,895 B2 * | 3/2005 | Osame et al. .................... 377/78 |
| 6,980,191 B2 | 12/2005 | Nakamura et al. |
| 7,079,617 B2 | 7/2006 | Osame et al. |
| 7,142,030 B2 * | 11/2006 | Osame et al. .................. 327/218 |
| 7,301,382 B2 * | 11/2007 | Osame et al. .................. 327/218 |
| 8,004,334 B2 * | 8/2011 | Osame et al. .................. 327/218 |
| 2001/0035862 A1 | 11/2001 | Nakamura et al. |
| 2002/0021295 A1 * | 2/2002 | Koyama et al. ............... 345/205 |
| 2002/0036625 A1 | 3/2002 | Nakamura |
| 2002/0075211 A1 * | 6/2002 | Nakamura ....................... 345/87 |
| 2003/0174115 A1 | 9/2003 | Washio et al. |
| 2005/0134325 A1 | 6/2005 | Osame et al. |

FOREIGN PATENT DOCUMENTS

| | | | |
|---|---|---|---|
| EP | 0510696 | A1 | 10/1992 |
| EP | 0695035 | A1 | 1/1996 |
| EP | 903722 | A2 | 3/1999 |
| EP | 1056069 | A2 | 11/2000 |
| EP | 1150274 | A2 | 10/2001 |
| JP | 59097220 | A | 6/1984 |
| JP | 1319322 | A | 12/1989 |
| JP | 04264814 | A | 9/1992 |
| JP | 5094159 | A | 4/1993 |
| JP | 7273616 | A | 10/1995 |
| JP | 9083316 | A | 3/1997 |
| JP | 11055087 | A | 2/1999 |
| JP | 11184432 | A | 7/1999 |
| JP | 11184440 | A | 7/1999 |
| JP | 2000339984 | A | 12/2000 |
| JP | 2002175040 | A | 6/2002 |
| JP | 2002287711 | A | 10/2002 |
| KR | 20000035530 | A | 6/2000 |

OTHER PUBLICATIONS

International Search Report from Application No. PCT/JP03/15385 mailed Mar. 30, 2004.

Search Report (European Patent Application No. 03776011.3) dated May 7, 2008.

Daily, W. et al., "12.1 Latch and Flip-Flop", Digital Systems Engineering, Mar. 30, 2003, pp. 720-721, Maruzen, with English translation.

Korean Office Action (Application No. 2005-7009014) dated Sep. 16, 2010 with English translation.

* cited by examiner (A)

THRESHOLD POTENTIAL (A)

(B)

DATA LATCH CIRCUIT AND ELECTRONIC DEVICE

CROSS-REFERENCE TO RELATED APPLICATIONS

This application is a continuation of U.S. application Ser. No. 11/877,730, filed Oct. 24, 2007, now allowed, which is a continuation of U.S. application Ser. No. 11/563,451, filed Nov. 27, 2006, now U.S. Pat. No. 7,301,382, which is a continuation of U.S. application Ser. No. 10/724,365, filed Dec. 1, 2003, now U.S. Pat. No. 7,142,030, which claims the benefit of foreign priority application filed in Japan as Serial No. 2002-351672 on Dec. 3, 2002, all of which are incorporated by reference.

TECHNICAL FIELD

The present invention relates to a data latch circuit which samples digital signals, and the present invention relates to an active matrix display device using the data latch circuit in a portion of a driver circuit. In addition, the invention relates to an electronic device using the active matrix display device.

BACKGROUND ART

In recent years, development of active matrix display devices such as a liquid crystal display device and a light emitting device has been advancing in response to the demand for its application to mobile devices and the like. In particular, technologies for integrally forming pixel circuits and driver circuits (hereinafter collectively referred to as an 'internal circuit') using thin film transistors (Thin Film Transistors; TFTs) formed of polycrystalline semiconductors (poly-Si; polysilicon) formed on an insulator are actively developed. The internal circuit includes a source signal line driver circuit, a gate signal line driver circuit or the like. These driver circuits or the like control the pixel circuits which are arranged in matrix.

In addition, the internal circuit is connected to a controller IC or the like (hereinafter referred to as an 'external circuit') through an FPC (Flexible Printed Circuit) and the operation is controlled. Generally, a drive voltage (namely, amplitude of a signal) of an IC used as an external circuit is lower than a drive voltage of an internal circuit in view of reduction in power consumption. At present, an IC which operates at a voltage of 3.3 V is typically used as an external circuit, while a drive voltage of an internal circuit is at 10 V, which is higher as compared to that of the external circuit. Therefore, it is necessary in the case of inputting a signal at 3.3 V from the external circuit to the internal circuit that the amplitude of the signal is converted with a level shift circuit or the like so as to be at around 10 V.

However, in the case of level shifting in the external circuit, such problems arise as an increase of components such as a level shift IC and a power supply IC and an increase in the power consumption. On the other hand, in the case of level shifting in the internal circuit before inputting to a shift register, a data latch circuit or the like, such problems arise as an increase in a layout area and the power consumption or the difficulty of high frequency operation. Therefore, it is required a method for directly inputting a signal having an amplitude of a low voltage from an external circuit to a shift register, a data latch circuit or the like which compose a driver circuit of the internal circuit to obtain an accurate operation (this method is hereinafter referred to as 'low voltage drive').

As a driving method of an active matrix display device, there are a digital drive method and an analog drive method. In the case of using the digital drive method, a data latch circuit which samples digital video signals in sequence according to sampling pulses from a shift register is required in the a source signal line driver circuit which compose a internal circuit.

Among data latch circuits, there is the one which deals with an input of a low voltage signal (refer to the following Patent Document 1).
(Patent Document 1: Japanese Patent Laid-Open No. Hei11-184440)

However, the data latch circuit which deal with an input of a low voltage signal may malfunction due to the influence of variations in the TFT characteristics.

Now, a general conventional data latch circuit is shown in FIG. 2(A). The data latch circuit includes a clocked inverter 2005 and an inverter 2006. The clocked inverter 2005 includes P-channel TFTs 2001 and 2002 and N-channel TFTS 2003 and 2004 all connected in series. The gate electrode of the P-channel TFT 2001 is input with a sampling pulse (LAT) from a shift register while the source electrode have a connecting structure such that a power supply VDD is supplied. The gate electrode of the N-channel TFT 2004 is input with an inverted pulse (LATB) of the sampling pulse (LAT) while the source electrode have a connecting structure such that a power supply VSS is supplied. The gate electrodes of the P-channel TFT 2002 and the N-channel TFT 2003 are input with a digital signal (DATA). In addition, the drain electrodes of the P-channel TFT 2002 and the N-channel TFT 2003 are connected to the inverter 2006.

FIG. 2(B) is a timing chart of the conventional data latch circuit in FIG. 2(A). Operation of the conventional data latch circuit is described with reference to FIGS. 2(A) and 2(B). It should be noted that a digital signal (hereinafter referred to as a 'data signal') to be input has a digital format, that is a signal having a potential representing '1' and a potential representing '0'. In this specification, the level of the potential representing '1' is referred to as 'H level' and a potential representing '0' is referred to as 'L level' in any case, regardless of the potential. The potential level satisfies L level<H level unless specially described.

First, in a period T1, the sampling pulse (LAT) at L level is input from a shift register. Then, the LAT is at L level and the LATB is at H level, turning ON the P-channel TFT 2001 and the N-channel TFT 2004. At this time, when the DATA is at H level, the P-channel TFT 2002 is turned OFF while the N-channel TFT 2003 is turned ON, thus the clocked inverter 2005 outputs VSS. On the other hand, when the DATA is at L level, the P-channel TFT 2002 is turned ON while the N-channel TFT 2003 is turned OFF, thus the clocked inverter 2005 outputs VDD.

Problems to be Solved by the Invention

In the conventional data latch circuit, its drive is described with reference to FIGS. 2A and 2B in the case of performing low voltage drive, that is the case of directly inputting the digital signal DATA from an external circuit. It is assumed here that VSS is −2 V, VDD is 5 V, H level each of LAT and LATB is 5 V, L level is −2 V, and H level of DATA is 3V, and L level is at 0 V.

First, in the period T1, a sampling pulse, LAT is input from a shift register. Then, the LAT is at H level (5V) while the LATB is at L level (−2V), thereby turning ON the P-channel TFT 2001 and the N-channel 2004. At this time, when the DATA is at H level (3V), the P-channel TFT 2002 is turned OFF while the N-channel TFT 2003 is turned ON. Thus, the clocked inverter 2005 outputs VSS. At this time, however, if the threshold voltage $|V_{TH}|$ of the P-channel TFT 2002 is 2 V or less, the P-channel TFT 2002 is incidentally turned ON and thus a leakage current flows.

Furthermore, the characteristics of the P-channel TFT 2002 and the N-channel TFT, in particular, the threshold characteristics vary. As a result, when the ON current of the P-channel TFT 2002 at $|V_{gs}|=2$ V is larger than the ON current of the N-channel TFT 2003 at $|V_{gs}|=5$ V, the logic is inverted, which causes the output of the clocked inverter 2005 to be at VDD, not VSS.

On the other hand, when the DATA is at L level (0V) and when the $|V_{TH}|$ of the N-channel TFT 2003 is 2 V or less, the N-channel TFT 2003 is incidentally turned ON and thus a leakage current flows. Furthermore, when the ON current of the N-channel TFT 2003 at $|V_{gs}|=2$ V is larger than the ON current of the P-channel TFT 2002 at $|V_{gs}|=5$ V, the logic is inverted, which causes the output of the clocked inverter 2005 to be at VSS, not VDD.

The invention is made in view of the foregoing problems and provides a data latch circuit which is hardly influenced by variations in the TFT characteristics, and capable of operating with low power consumption and high frequency.

DISCLOSURE OF THE INVENTION

Means for Solving the Problem

The data latch circuit of the invention having an inverter which determines a data signal to be at H level or at L level is constructed such that a means for short-circuiting an input terminal and an output terminal of the inverter is provided, the input terminal of the inverter is connected to one electrode of a capacitor, and the other electrode of the capacitor samples a data signal or a reference potential.

By firstly, short-circuiting the input terminal and the output terminal of the inverter, the input terminal of the inverter and the one terminal of the capacitor are set at the threshold potential of the inverter, while the other electrode of the capacitor is set at the reference potential.

Then, a data signal is sampled to the other electrode of the capacitor which is set at the reference potential. Accordingly, the potential of the input terminal of the inverter which is connected through the capacitor changes higher or lower from the threshold potential, and thus it becomes possible to determine the data signal to be at H level or at L level.

Therefore, an accurate operation can be obtained without being influenced by variations in the TFT characteristics even when the amplitude of the data signal is small relatively to the width of the power supply voltage.

The structure of the invention is described below.

The data latch circuit of the invention which samples a digital signal includes a capacitor means having first and second electrodes, an inverter whose input terminal is connected to the first electrode, and a switch connected between the input terminal and an output terminal of the inverter, and is characterized in that the switch is turned ON to input a first potential to the second electrode of the capacitor means during a reset period, and the digital signal is input to the second electrode of the capacitor means during a sampling period after the reset period.

The data latch circuit of the invention which samples a digital signal includes a capacitor means having first and second electrodes, an inverter whose input terminal is connected to the first electrode, a first switch connected between the input terminal and an output terminal of the inverter, and second and third switches connected to the second electrode, and the data latch circuit is characterized in that the first switch and the second switch are turned ON to input a first potential to the second electrode of the capacitor means during a reset period, and the third switch is turned ON to input the digital signal to the second electrode of the capacitor means during a sampling period after the reset period.

The data latch circuit of the invention which samples a digital signal includes a capacitor means having first and second electrodes, a first inverter whose input terminal is connected to the first electrode, a switch connected between the input terminal and an output terminal of the first inverter, a second inverter whose input terminal is connected to the output terminal of the rust inverter, and a clocked inverter whose output terminal and input terminal are connected to the input terminal and an output terminal of the second inverter respectively, and is characterized in that the switch is turned ON to input a first potential to the second electrode of the capacitor means during a reset period, and the digital signal is input to the second electrode of the capacitor means during a sampling period after the reset period.

The data latch circuit of the invention which samples a digital signal includes a capacitor means having first and second electrodes, a first inverter whose input terminal is connected to the first electrode, a first switch connected between the input terminal and an output terminal of the first inverter, second and third switches connected to the second electrode, a second inverter whose input terminal is connected to the output terminal of the first inverter, and a clocked inverter whose output terminal and input terminal are connected to the input terminal and an output terminal of the second inverter respectively, and is characterized in that the first switch and the second switch are turned ON to input a first potential to the second electrode of the capacitor means during a reset period, and the third switch is turned ON to input the digital signal to the second electrode of the capacitor means during a sampling period after the reset period.

The data latch circuit of the invention which samples a digital signal includes a capacitor means having first and second electrodes, a first inverter whose input terminal is connected to the first electrode, a switch connected between the input terminal and an output terminal of the first inverter, a second inverter whose input terminal is connected to the output terminal of the first inverter, and a clocked inverter whose output terminal and input terminal are connected to the input terminal and the output terminal of the first inverter respectively, and is characterized in that the switch is turned ON to input a first potential to the second electrode of the capacitor means during a reset period, and the digital signal is input to the second electrode of the capacitor means during a sampling period after the reset period.

The data latch circuit of the invention which samples a digital signal includes a capacitor means having first and second electrodes, a first inverter whose input terminal is connected to the first electrode, a first switch connected between the input terminal and an output terminal of the first inverter, second and third switches connected to the second electrode, a second inverter whose input terminal is connected to the output terminal of the first inverter, and a clocked inverter whose output terminal and input terminal are connected to the input terminal and the output terminal of the first inverter respectively, and is characterized in that the first switch and the second switch are turned ON to input a first potential to the second electrode of the capacitor means during a reset period, and the third switch is turned ON to input the digital signal to the second electrode of the capacitor means during a sampling period after the reset period.

The data latch circuit of the invention which samples a digital signal includes a first capacitor means having first and second electrodes, a second capacitor means having third and fourth electrodes, an inverter whose input terminal is connected to the first electrode and the third electrode, and a switch connected between the input terminal and an output terminal of the inverter, and is characterized in that the switch is turned ON to input a first potential to the second electrode of the first capacitor means and to input a second potential to the fourth electrode of the third capacitor means during a reset period, and the digital signal is input to the second electrode of the first capacitor means and to the fourth electrode of the second capacitor means during a sampling period after the reset period.

The data latch circuit of the invention which samples a digital signal includes a first capacitor means having first and second electrodes, a second capacitor means having third and fourth electrodes, an inverter whose input terminal is connected to the first electrode and the third electrode, a first switch connected between the input terminal and an output terminal of the inverter, second and third switches connected to the second electrode, and fourth and fifth switches connected to the fourth electrode, and is characterized in that the switch and the second switch are turned ON to input a first potential to the second electrode of the first capacitor means while the fourth switch is turned ON to input a second potential to the fourth electrode of the third capacitor means during a reset period, and the third switch is turned ON to input the digital signal to the second electrode of the first capacitor means while the fifth switch is turned ON to input the digital signal to the fourth electrode of the second capacitor means during a sampling period after the reset period.

The data latch circuit of the invention which samples a digital signal includes a first capacitor means having first and second electrodes, a second capacitor means having third and fourth electrodes, a first inverter whose input terminal is connected to the first electrode and whose output terminal is connected to the third electrode, a first switch connected between the input terminal and the output terminal of the first inverter, a third capacitor means having fifth and sixth electrodes, a fourth capacitor means having seventh and eighth electrodes, a second inverter whose input terminal is connected to the fifth electrode and whose output terminal is connected to the seventh electrode, a second switch connected between the input terminal and the output terminal of the second inverter, and a third inverter whose input terminal is connected to the fourth and eighth electrodes, and a third switch connected between the input terminal and an output terminal of the third inverter, and is characterized in that the first and second switches are turned ON to input a first potential to the second electrode of the first capacitor means and to input a second potential to the fourth electrode of the third capacitor means during a reset period, and the digital signal is input to the second electrode of the first capacitor means and to the fourth electrode of the second capacitor means during a sampling period after the reset period.

The data latch circuit of the invention which samples a digital signal includes a first capacitor means having first and second electrodes, a second capacitor means having third and fourth electrodes, a first inverter whose input terminal is connected to the first electrode and whose output terminal is connected to the third electrode, a first switch connected between the input terminal and the output terminal of the first inverter, a third capacitor means having fifth and sixth electrodes, a fourth capacitor means having seventh and eighth electrodes, a second inverter whose input terminal is connected to the fifth electrode and whose output terminal is connected to the seventh electrode, a second switch connected between the input terminal and the output terminal of the second inverter, a third inverter whose input terminal is connected to the fourth and the eighth electrodes, a third switch connected between the input terminal and the output terminal of the third inverter, and a fifth capacitor connected to the first electrode and the fifth electrode, and is characterized in that the first and second switches are turned ON to input a first potential to the second electrode of the first capacitor means and to input a second potential to the fourth electrode of the third capacitor means during a reset period, and the digital signal is input to the second electrode of the first capacitor means and to the fourth electrode of the second capacitor means during a sampling period after the reset period.

The first potential may be a potential of 1 or a potential of 0 as the digital signal.

It may possible to determine the reset period with a sampling pulse from a shift register of the preceding stage while determining the sampling period with a sampling pulse from a shift register of the present stage.

The amplitude of the digital signal may be set comparatively smaller than the width of a power supply voltage which is used for the data latch circuit.

An output pulse from the shift register of the preceding stage may be used for a control terminal of the clocked inverter.

In addition, the data latch circuit may be formed by using thin film transistors.

Effect of the Invention

According to the data latch circuit of the invention, an accurate operation can be obtained without being influenced by variations in the TFT characteristics even when the amplitude of an input signal is small relatively to the width of a power supply voltage.

Therefore, signals from an external circuit are not required to be level shifted, and thus reduction in power consumption, layout area and cost can be achieved.

BEST MODE FOR CARRYING OUT THE INVENTION

Embodiment Modes of the invention are described below.

Embodiment Mode 1

Figure 1:
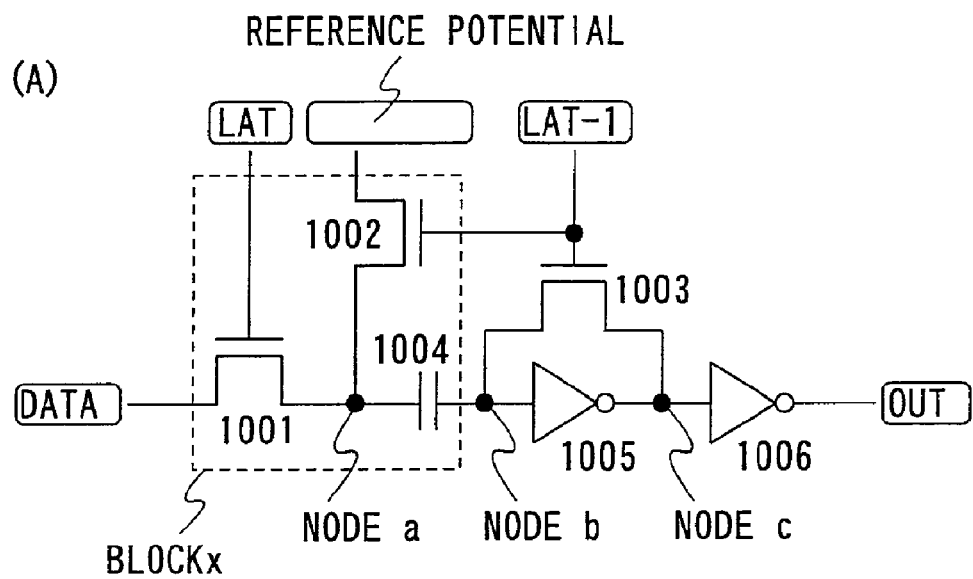
FIG. 1 are diagrams showing an embodiment mode of the invention.
Figure 1:
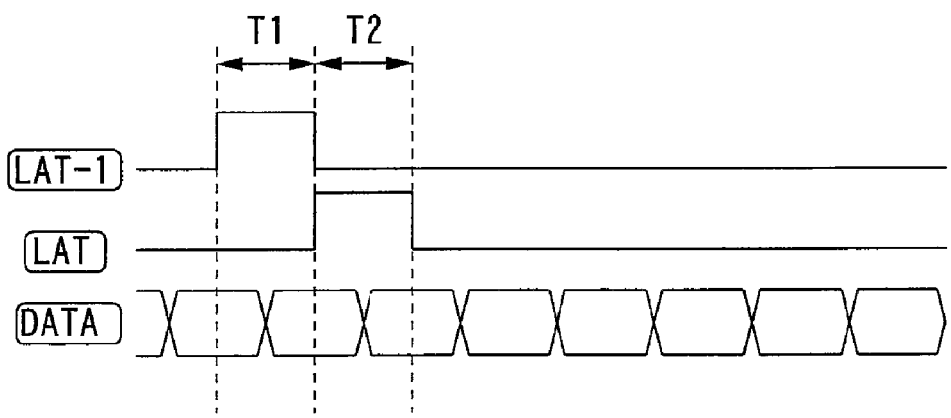
Figure 2:
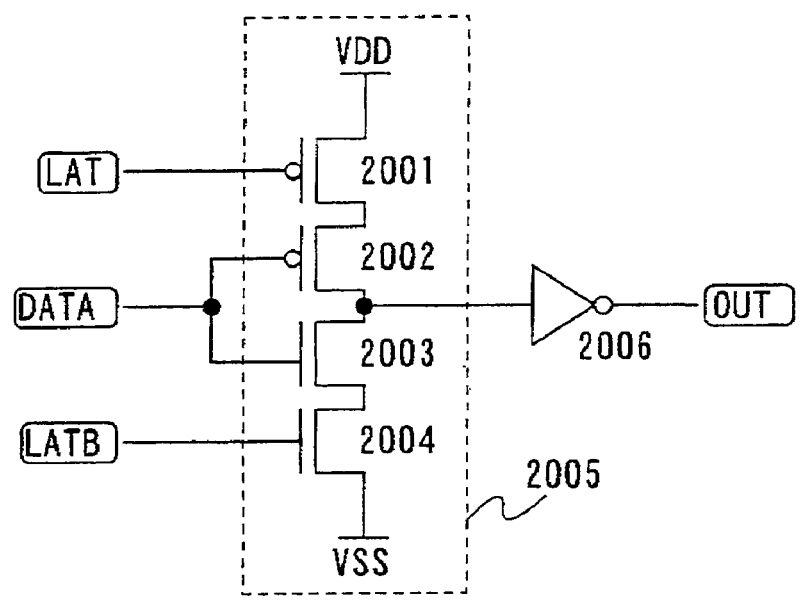
FIG. 2 are diagrams showing a conventional data latch circuit.
Figure 2:
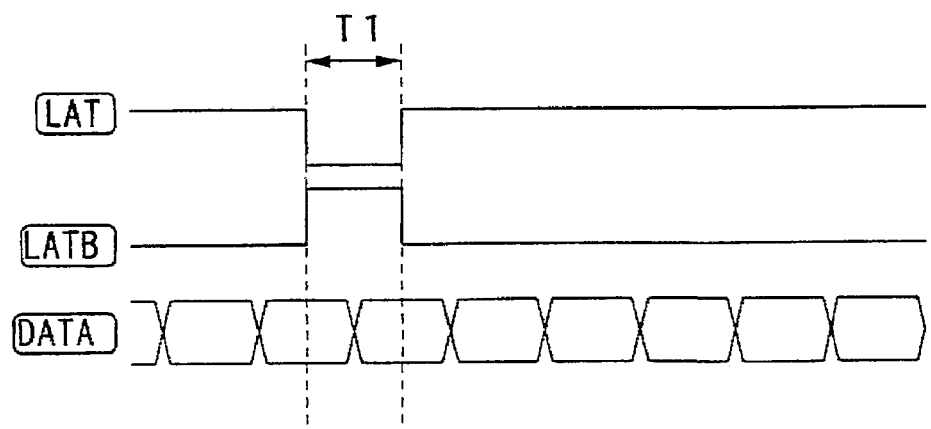

FIG. 1(A) shows a configuration of a data latch circuit of this embodiment mode.

The data latch circuit of this embodiment mode includes a data sampling switch 1001, a reference switch 1002, a switch 1003 for setting the threshold value, a capacitor means 1004 and a correction inverter 1005. In the data latch circuit of this embodiment mode, a circuit block including the data sampling switch 1001, the reference switch 1002 and the capacitor means 1004 is denoted by 'block x'. In addition, an inverter 1006 may be provided if necessary.

ON/OFF of the data sampling switch 1001 is controlled by a LAT. DATA to be input is input to a connecting node (hereinafter referred to as a 'node a') of the reference switch 1002 and a second electrode of the capacitor means 1004. ON/OFF of the reference switch 1002 is controlled by a LAT-1. The reference switch 1002 samples a first potential (referred to as a 'reference potential' herein), and outputs the reference potential to a connecting node of the data sampling switch 1001 and the second electrode of the capacitor means 1004, namely the node a. An input terminal and an output terminal of the correction inverter 1005 are electrically connected through the switch 1003 for setting the threshold value. Connecting nodes between the input terminal of the correction inverter 1005 and the switch 1003 for setting the threshold value and between the output terminal thereof and the switch 1003 for setting the threshold value are referred to as a 'node b' and a 'node c' respectively. ON/OFF of the switch 1003 for setting the threshold value is controlled by the LAT-1. The correction inverter 1005 outputs data to the inverter 1006 which is connected to the node c.

FIG. 1(B) is a timing chart of the data latch circuit of this embodiment mode. Operation is described in the case where the data latch circuit of this embodiment mode is driven at a low voltage with reference to FIG. 1(A) and FIG. 1(B). It is assumed in this embodiment mode that VSS is −2 V, VDD is 5 V, H level of each of LAT, LATB, LAT-1 and LAT-1B is 5 V while L level thereof is −2 V, H level of DATA is 3 V while L level thereof is 0 V, and a reference potential is 1.5 V which is an intermediate potential between the L level and the H level of the DATA. It is preferable that the LAT which is input during a period T1 does not overlap with the pulse LAT-1 which is input during a period T2.

First, a reset operation is performed in the period T1. A sampling pulse LAT-1 (5 V) is input from a shift register of the preceding stage to the present data latch circuit, whereby the reference switch 1002 and the switch 1003 for setting the threshold value are turned ON. As a result, the node a is at a reference potential (1.5 V). Since the potential of the node c is feedbacked, the potential of the node b become unchanged, and the potential of the node b is at the threshold potential of the correction inverter 1005 (assumed to be 2 V here).

Subsequently, the period T2 starts, in which the present data latch circuit determines the input DATA to be at H level or at L level. The sampling pulse LAT (5 V) from the shift register is input to the present data latch circuit, whereby the data sampling switch 1001 is turned ON. When the input DATA is at H level (3 V), the potential of the node a changes from 1.5 V to 3 V. Since potential difference between both ends of the capacitor means 1004 is held, the potential of the node b changes by around the amount of voltage change at the node a. Accordingly, the potential of the node b is raised from 2 V by around 1.5 V, reaching around 3.5 V.

Figure 3:
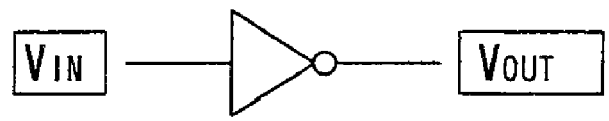
FIG. 3 are diagrams showing the $V_{IN}$-$V_{OUT}$ characteristics of a general inverter.
Figure 3:
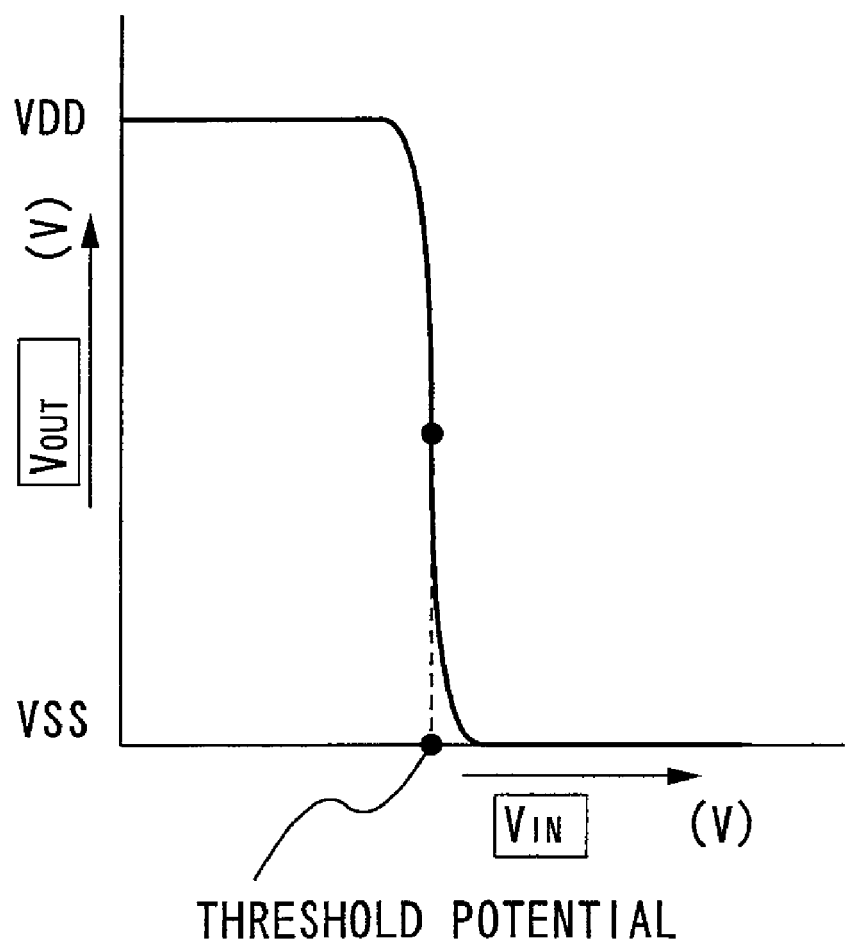

FIG. 3 show the $V_{IN}$ (input signal voltage)-$V_{OUT}$ (output signal voltage) characteristics of a general inverter. As shown in FIG. 3, when $V_{IN}$ changes higher or lower than the threshold value even by a small amount, $V_{OUT}$ draws closer to VDD or VSS to a large degree.

Since the node b is set at the threshold potential of the correction inverter 1005 in the period T1, the node c sensitively reacts to the change in potential of the node b. In this case, as the potential of the node b is raised from 2 V to around 3.5 V, the potential of the node c draws closer to VSS to a large degree. The potential of the node c is adjusted by the inverter 1006, and VDD (H level) is output to the output OUT.

On the other hand, when the DATA in the period T2 is at L level (0 V), the potential of the node a drops from 1.5 V to 0 V, and the potential of the node b drops from 2 V by around 1.5 V, reaching around 0.5 V. In this manner, since the potential of the node b drops from the threshold potential, the potential of the node c draws closer to VDD to a large degree. The potential of the node c is further adjusted by the inverter 1006, and VSS (L level) is output to the output OUT.

In addition, in the case where the reference potential is a fixed potential, it is ideally an intermediate potential of an amplitude of the data signal (DATA here), however, it is not necessarily the intermediate potential in a strict sense. The reference potential can be changed to a degree within the amplitude of the data signal while being different from the highest potential or the lowest potential of the data signal.

Alternatively, an inverted signal of the data signal DATA may be input as a reference potential after shifting it forth by one data. In this case, when the DATA is at H level (3 V) for example, the node a is at L level (0 V) in the reset period T1, and when the DATA at H level (3 V) is input in the sampling period T2, the node a and the node b change by around 3 V, which facilitate the accurate operation of the correction inverter 1005. Even when the DATA is at L level (0 V), the node a is at H level (3 V) in the reset period T1 and the DATA at L level (0 V) is input in the sampling period T2. Therefore, the node a and the node b change by around 3 V in a similar manner.

In the data latch circuit, as described in this embodiment mode, the threshold potential of the inverter which outputs after determining the data signal DATA to be at H level or at L level is obtained in advance, and the data signal is determined to be at H level or L level based on its change whether being higher or lower than the threshold potential. Thus, an accurate operation can be obtained without being influenced by the threshold changes due to variations in the TFT characteristics even when the amplitude of an input signal is small relatively to the width of a power supply voltage. Therefore, low power consumption and high frequency operation are achieved. In particular, it is preferable that the invention is applied to a data latch circuit using polysilicon TFTs that have large variations in the TFT characteristics.

In addition, as for a crystallization method in the manufacture of the polysilicon TFTs according to the invention, laser crystallization, thermal crystallization using RTA, an annealing furnace, thermal crystallization using a metal element which facilitates the crystallization, or combination of these crystallization methods can be employed.

Embodiment Mode 2

Figure 6:
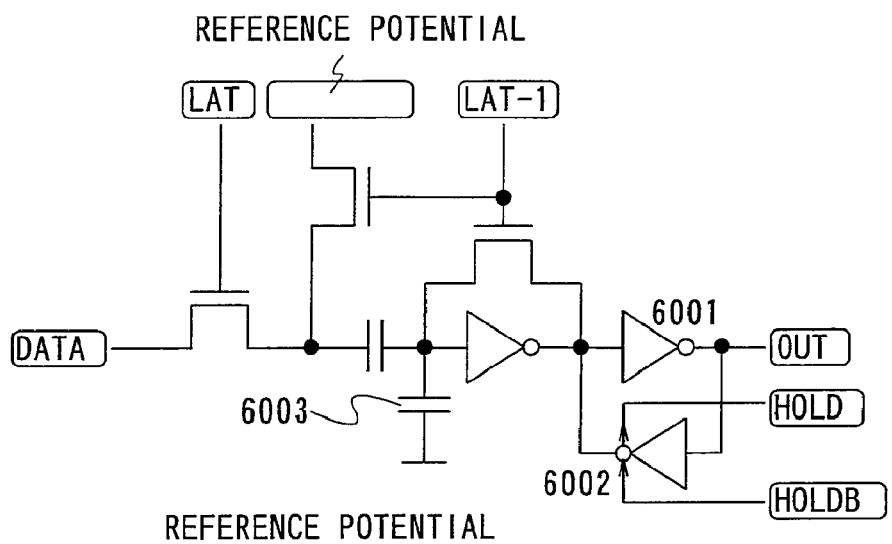
FIG. 6 are diagrams showing an embodiment mode of the invention.
Figure 6:
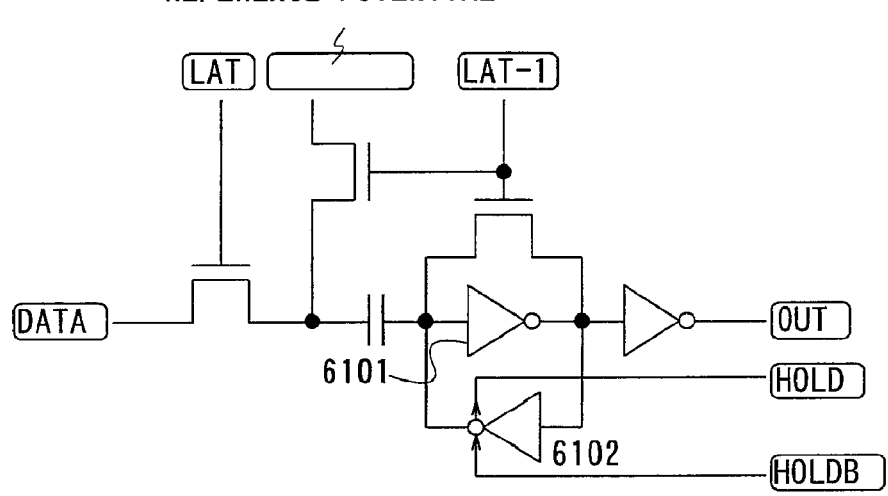
Figure 6:
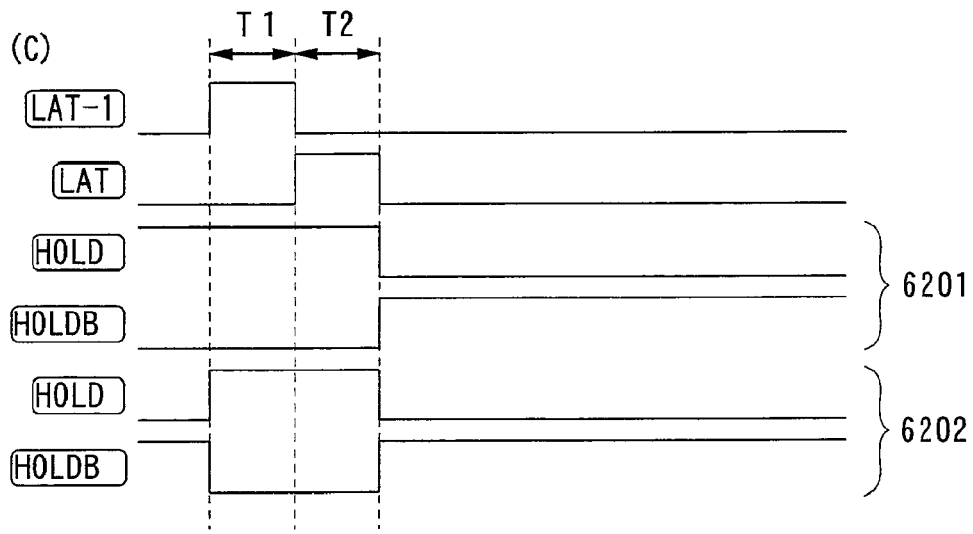

In the case of using the data latch circuit shown in FIG. 1(A), holding may be carried out by using a clocked inverter 6002 or the like, or holding may be carried out by using a capacitor means 6003 or the like as shown in FIGS. 6(A) and 6(B). As for the clocked inverter 6002, a general clocked inverter can be employed.

Figure 10:
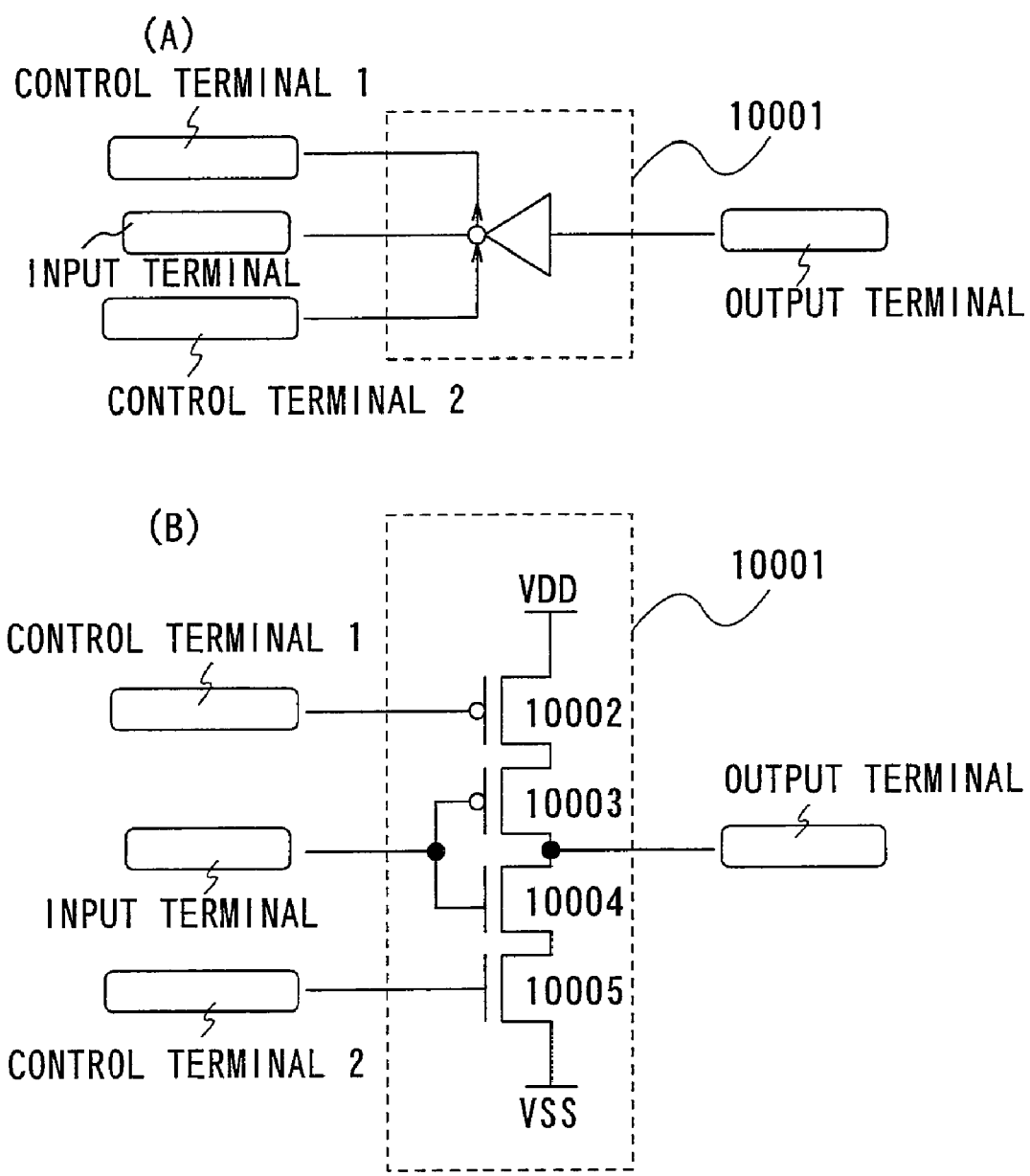
FIG. 10 are diagrams showing a general clocked inverter.

The general clocked inverter is shown in FIG. 10. A clocked inverter 10001 includes a first P-channel TFT 10002, a second P-channel TFT 10003, a first N-channel TFT 10004 and a second N-channel TFT 10005 all connected in series. It is assumed that a terminal which inputs to the gate electrode of the first P-channel TFT 10002 is a control terminal 1, a terminal which inputs to the gate electrodes of the second P-channel TFT 10003 and the first N-channel TFT 10004 is an input terminal, a terminal which inputs to the gate electrode of the second N-channel TFT 10005 is a control terminal 2, and a connecting terminal of the second P-channel TFT 10003 and the first N-channel TFT 10004 is an output terminal.

FIG. 6(A) corresponds to FIG. 1(A) additionally provided with the capacitor means 6003 and the clocked inverter 6002. The clocked inverter 6002 is connected to an inverter 6001 in loop configuration. A holding pulse HOLD is input to a control terminal 1 of the clocked inverter 6002 while an inverted pulse HOLDB of the HOLD is input to a control terminal 2 thereof. The rest of the components are similar to FIG. 1(A).

FIG. 6(B) corresponds to FIG. 1(A) additionally provided with a clocked inverter 6102. The clocked inverter 6102 is connected to a correction inverter 6101 in loop configuration. A holding pulse HOLD is input to a control terminal 1 of the clocked inverter 6102 while an inverted pulse HOLDB of the HOLD is input to a control terminal 2 thereof. The rest of the components are similar to FIG. 1(A).

The HOLD pulse is preferably a pulse such as 6201 and 6202 shown in the timing chart in FIG. 6(C). An output pulse of a shift register may be employed for such pulse. As for the operation, after a sampling period T2 terminates, the clocked inverter 6002 or 6102 is turned ON, and then a holding operation starts.

By carrying out holding using the clocked inverter or the like as in this embodiment mode, H level and L level can be held accurately for a predetermined period.

Embodiment Mode 3

Figure 7:
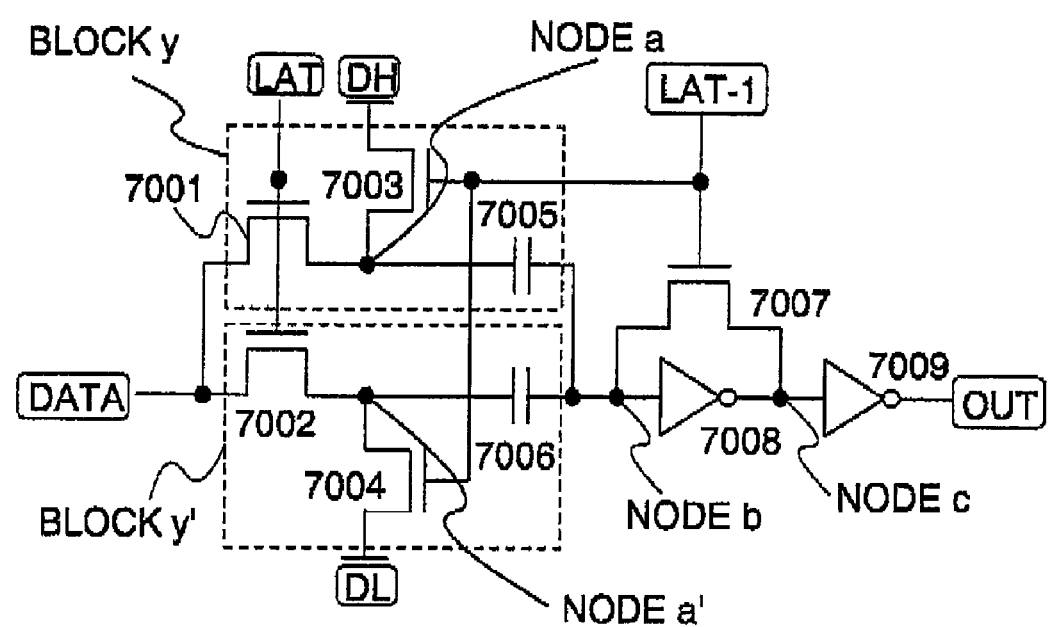
FIG. 7 is a diagram showing an embodiment mode of the invention.

FIG. 7 shows the case in which two blocks x in the data latch circuit in FIG. 1(A) are connected in parallel. One of two reference potentials which are input to the two reference switches respectively is set at the highest potential (potential having an equal level to the H level of the DATA) while the other is set at the lowest potential (potential having an equal level to the L level of the DATA).

The data latch circuit in this embodiment mode includes a block y and a block y' connected in parallel, a correction inverter 7008 whose input terminal is connected to one of the connecting nodes of the block y and the block y', an inverter 7009 connected to the correction inverter 7008 in series, a switch 7007 for setting the threshold value connected between an input terminal and an output terminal of the correction inverter 7008, and a clocked inverter 7009.

The block y includes a first data sampling switch 7001 and a first capacitor means 7005 connected in series, and a first reference switch 7003 for inputting a signal DH to their connecting node (hereinafter referred to as a 'node a'). The block y' includes a second data sampling switch 7002 and a second capacitor means 7006 connected in series, and a second reference switch 7004 for inputting a signal DL to their connecting node (hereinafter referred to as a 'node a').

In addition, ON/OFF of each of the first data sampling switch 7001 and the second data sampling switch 7002 is controlled by the LAT, thereby sampling the DATA. ON/OFF of each of the first reference switch 7003, the second reference switch 7004 and the switch 7007 for setting the threshold value is controlled by the LAT-1. The switch 7007 for setting the threshold value is provided between the input terminal and the output terminal of the correction inverter 7008. The connecting nodes between the input terminal of the correction inverter 7008 and the switch 7007 for setting the threshold value and between the output terminal of the correction inverter 7008 and the switch 7007 for setting the threshold value are referred to as a 'node b' and a 'node c' respectively. It is assumed in this embodiment mode that VSS is −2 V, VDD is 5 V, H level of each of LAT, LATB, LAT-1 and LAT-1B is 5 V while L level thereof is 0 V, and H level of DATA (DH) is 3 V while L level thereof (DL) is 0 V.

The timing chart in this embodiment is similar to the timing chart of Embodiment Mode 1 shown in FIG. 1(B). Therefore, description is given here with reference to FIG. 1(B). First, in the reset period T1, the LAT-1 is at H level (5 V), whereby the first reference switch 7003, the second reference switch 7004 and the switch 7008 for setting the threshold value are turned ON. Then, the node a is at a potential of DH (3 V) while the node a' is at a potential of DL (0 V). The node b is at the threshold voltage (assumed to be 2 V here) of the correction inverter 7008.

Subsequently, in the data sampling period T2, the LAT is at H level (5 V) and the LAT-1 is at L level (0 V). Then, the first data sampling switch 7001 and the second data sampling switch 7002 are turned ON. When the DATA is at H level (3 V), the node a remains unchanged as 3 V while the node a' changes from 0 V to 3 V. Thus, the node b is raised from 2 V by around 1.5 V, reaching 3.5 V. As a result, the node c draws closer to VSS (−2 V) to a large degree.

On the other hand, when the DATA is at L level (0 V), the node a changes from 3 V to 0 V while the node a' remains unchanged as 0 V. Thus, the node b drops from 2 V by around 1.5 V, reaching around 0.5 V. Accordingly, the node c draws closer to VDD (5 V) to a large degree.

As described above, according to the data latch circuit of this embodiment mode, an accurate operation can be obtained without being influenced by the TFT characteristics even when the amplitude of an input signal is small relatively to the width of a power supply voltage. Therefore, low power consumption and high frequency operation can be achieved. Furthermore, according to the data latch circuit of this embodiment mode, by setting one of the two reference potentials, which are input to the two reference switches respectively, at the highest potential (DH) of the data signal while setting the other at the lowest potential (DH) of the data signal, an intermediate potential used for the reference potential is not particularly required, which contributes to the reduction in the number of power supplies.

Embodiment Mode 4

Figure 8:
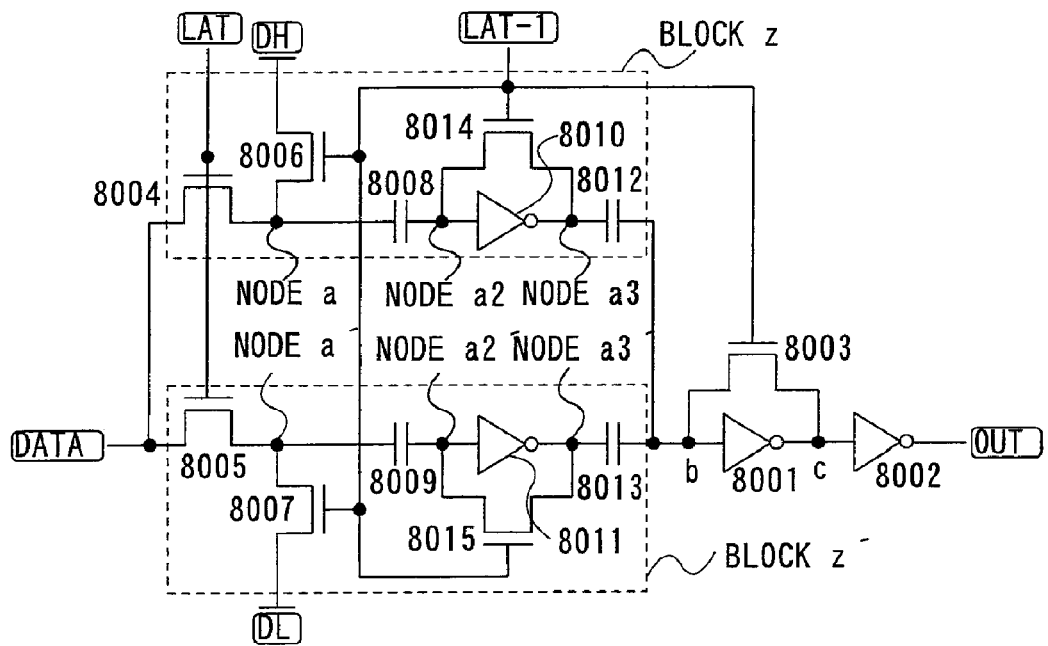
FIG. 8 are diagrams showing an embodiment mode of the invention.
Figure 8:
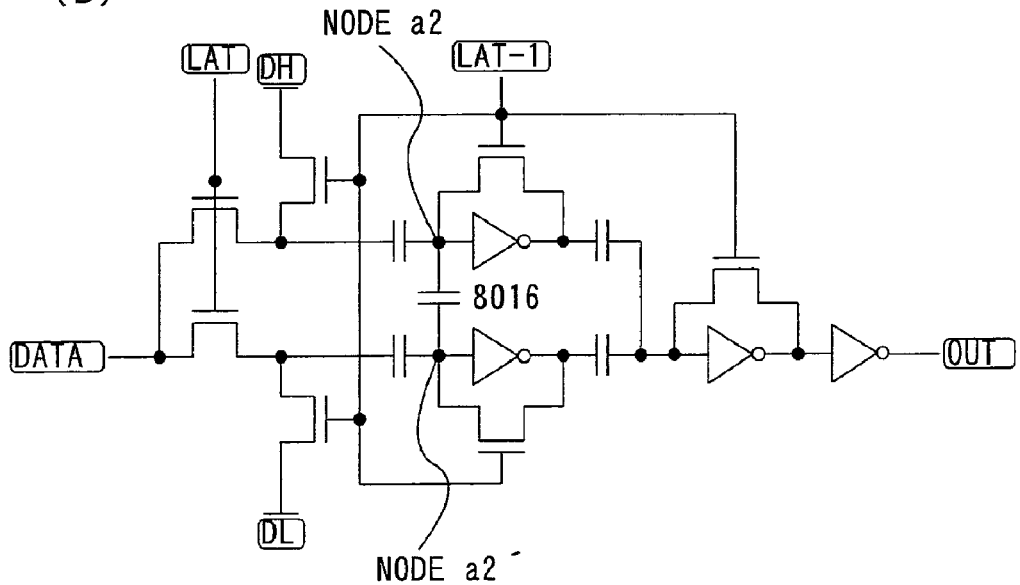

The data latch circuit of the invention having a different configuration from those in Embodiment Modes 1 to 3 is shown in FIG. 8(A).

The data latch circuit of this embodiment mode includes a block z and a block z' connected in parallel, a first correction inverter 8001 whose input terminal is connected to one of the connecting nodes of the block z and the block z', an inverter 8002 connected to the first correction inverter 8001 in series, and a first switch 8003 for setting the threshold value provided between the input terminal and the output terminal of the first correction inverter 8001.

The block z includes a first sampling switch 8004, a first capacitor means 8008, a second correction inverter 8010 and a third capacitor means 8012 all connected in series, a first reference switch 8006 for sampling the DH (potential having an equal level to the H level of DATA) to a connecting node (hereinafter referred to as a 'node a') of the first sampling switch 8004 and the first capacitor means 8008, and a second switch 8014 for setting the threshold value provided between an input terminal and an output terminal of the second correction inverter 8010. The block z' includes a second sampling switch 8005, a second capacitor means 8009, a third correction inverter 8011 and a fourth capacitor means 8013 all connected in series, a second reference switch 8007 for sampling the DL (potential having an equal level to the L level of DATA) to a connecting node (hereinafter referred to as a 'node a'') of the second sampling switch 8005 and the second capacitor means 8009, and a third switch 8015 for setting the threshold value provided between an input terminal and an output terminal of the third correction inverter 8011.

The DATA is input to the other connecting node of the block z and the block z', namely the connecting node of the first sampling switch 8004 and the second sampling switch 8005. ON/OFF of each of the first sampling switch 8004 and the second sampling switch 8005 is controlled by the LAT. ON/OFF of each of the first reference switch 8006, the second reference switch 8007, the second switch 8014 for setting the threshold value and the third switch 8015 for setting the threshold value is controlled by the LAT-1.

Connecting nodes between the input terminal of the first correction inverter 8001 and the first switch 8003 for setting the threshold value and between the output terminal of the first correction inverter 8001 and the first switch 8003 for setting the threshold value are referred to as a 'node b' and a 'node c' respectively. Connecting nodes between the input terminal of the second correction inverter 8010 and the second switch 8014 for setting the threshold value and between the output terminal of the second correction inverter 8010 and the second switch 8014 for setting the threshold value are referred to as a 'node a2' and a 'node a3' respectively. Connecting nodes between the input terminal of the third correction inverter 8011 and the third switch 8015 for setting the threshold value and between the output terminal of the third correction inverter 8011 and the third switch 8015 for setting the threshold value are referred to as a 'node a2' and a 'node a3' respectively.

The timing chart in this embodiment is similar to the timing chart of Embodiment Mode 1 shown in FIG. 1(B). Therefore, operation is described with reference to FIG. 1(B).

First, in the reset period T1, the LAT-1 is at H level (VDD), the node a is at a potential of DH, the node a' is at a potential of DL, the node a2 and the node a3 are at the threshold potential of the second correction inverter 8010, and the node a2' and the node a3' are at the threshold potential of the third correction inverter 8011.

Subsequently, in the data sampling period T2, the LAT is at H level (VDD) and the DATA is sampled. When the DATA is at H level, the potentials of node a and the node a2 remain unchanged while the potential of the node a' changes from DL to H level and the potential of the node a2' is raised by the amount of amplitude of the DATA. The potential of the node a3' draws closer to VSS to a large degree and the potential of the node b drops. Accordingly, the potential of the node c draws closer to VDD to a large degree.

On the other hand, when the DATA is at L, the potentials of the node a' and the node a2' remain unchanged while the potential of the node a changes from DH to L level and the potential of the node a2 drops by the amount of amplitude of the DATA. In addition, the potential of the node a3 draws closer to VDD to a large degree while the potential of the node b is raised. Thus, the potential of the node c draws closer to VSS to a large degree.

In addition, in the case where the potential of the node a2 when the DATA is at H level or the potential of the node a2' when the DATA is at L level is changed due to the switching noise at DATA sampling, which may cause malfunction, it is desirable that a fifth capacitor means 8016 is provided between the node a2 and the node a2' as shown in FIG. 8(B). By using the capacitor means 8016, the potentials of the node a2 and the node a2' change in the same direction, preventing malfunction.

As described above, according to the data latch circuit of this embodiment mode, an accurate operation can be obtained without being influenced by variations in the TFT characteristics even when the amplitude of an input signal is smaller than those of other Embodiment modes, relatively to the width of a power supply voltage. Therefore, low power consumption and high frequency operation are achieved. Furthermore, according to the data latch circuit of this embodiment mode, by setting one of the two reference potentials, which are input to the two reference switches respectively, at the highest potential (DH) of the data signal while setting the other at the lowest potential (DH) of the data signal, an intermediate potential used for the reference potential is not particularly required, which contributes to the reduction in the number of power supplies.

Although described heretofore in Embodiment Modes 1 to 4 is the case of employing an N-channel TFT for each of the data sampling switch, the reference switch, and the switch for setting the threshold value, all or some of them may be replaced by P-channel TFTs or analog switches having both N-channel and P-channel TFTs depending on the value of a power supply and a signal voltage or the amplitude of signals.

In addition, although a sampling pulse from the shift register of the preceding stage is used as the reset pulse LAT-1, it may a sampling pulse from the shift register on the several stages earlier, or a pulse may be input for resetting. Alternatively, all the stages may be reset at a time. The setting of the voltage is not limited to this as well.

EMBODIMENT

Embodiment 1

Described here is a configuration of an active matrix display device and its drive to which the data latch circuit of the invention is applied.

Figure 4:
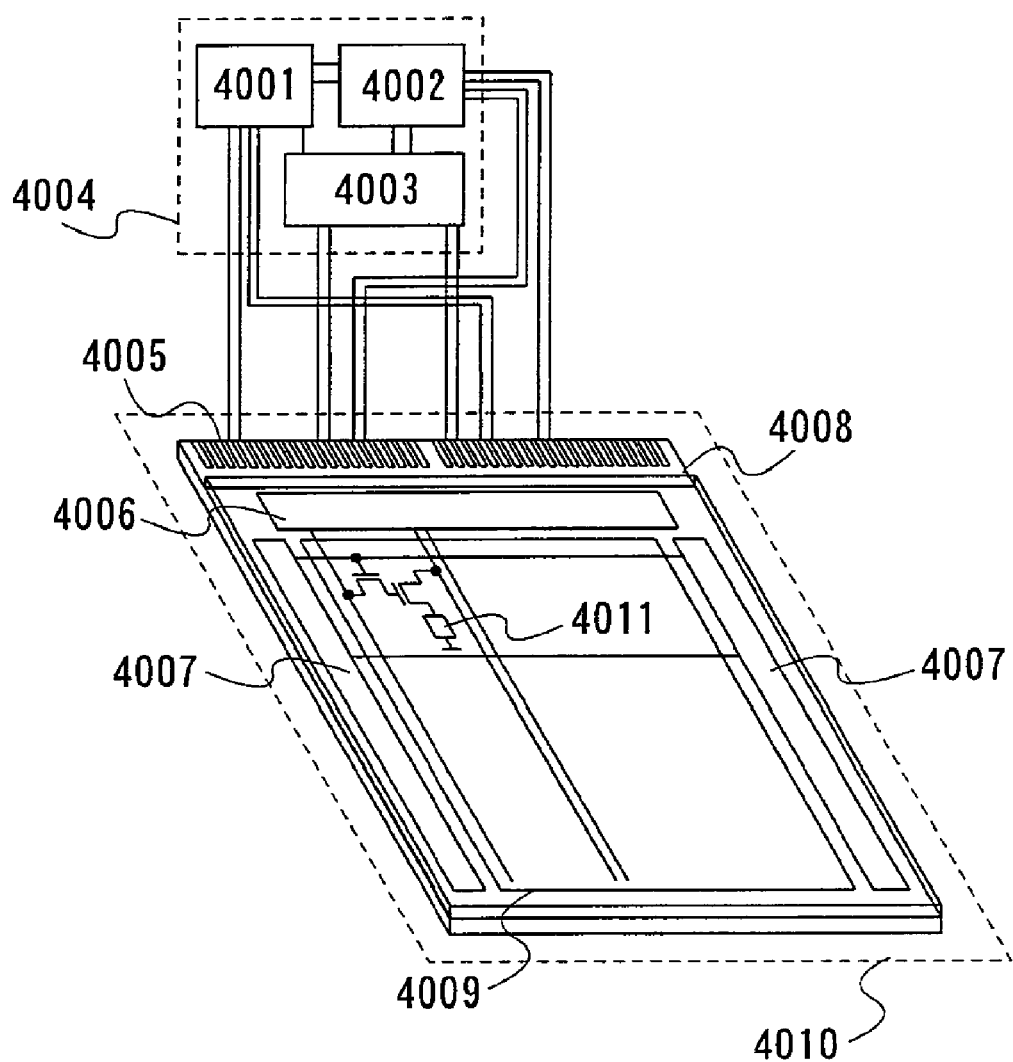
FIG. 4 is a schematic diagram of an external circuit and a display panel.

FIG. 4 is a block diagram of an external circuit and a schematic view of a panel. Taken here as an example is an active matrix EL display device.

As shown in FIG. 4, the active matrix display device includes an external circuit 4004 and a panel 4010. The external circuit 4004 includes an A/D converting unit 4001, a power supply unit 4002, and a signal generating unit 4003. The A/D converting unit 4001 converts a video data signal input as an analog signal into a digital signal, and then supplies it to a source signal line driver circuit 4006. The power supply unit 4002 generates a power supply having a desired value of voltage from a power supply such as a battery and an outlet, and supplies it to the source signal line driver circuit 4006, gate signal line driver circuits 4007, an EL element 4011, the signal generating unit 4003 or the like. The signal generating unit 4003 is input with a power supply, a video signal, a synchronizing signal or the like and converts various signals as well as generating a clock signal or the like for driving the source signal line driver circuit 4006 and the gate signal line driver circuits 4007.

The signal and power supply from the external circuit 4004 is input from an FPC connecting portion 4005 in the panel 4010 to the internal circuit, the EL element 4011 or the like through an FPC.

The panel 4010 includes the FPC connecting portion 4005, the internal circuit, and the EL element 4011 over a glass substrate 4008. The internal circuit includes the source signal line driver circuit 4006, the gate signal line driver circuits 4007, and a pixel portion 4009.

In the center of the substrate, the pixel portion 4009 is disposed, and the source signal line driver circuit 4006 and the gate signal line driver circuits 4007 are disposed on its periphery. The EL element 4011 and a counter electrode of the EL element are formed over an entire surface of the pixel portion 4009.

Figure 5:
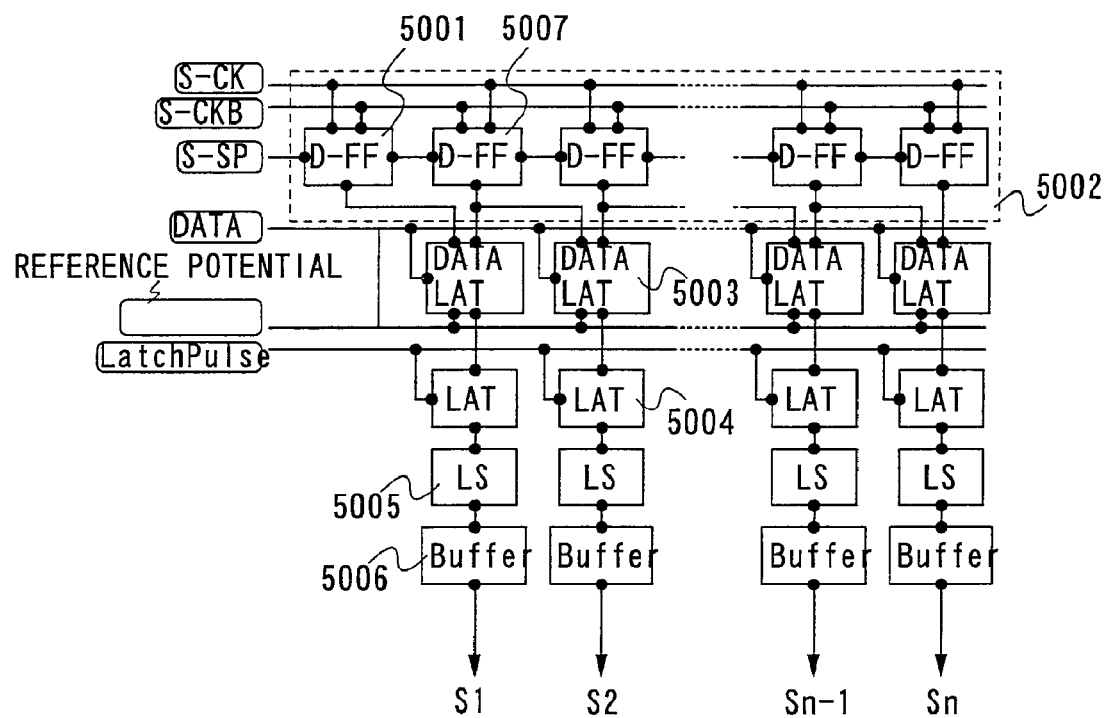
FIG. 5 is a diagram showing a configuration of a source signal line driver circuit.

FIG. 5 is a more detailed block diagram showing the source signal line driver circuit 4006.

The source signal line driver circuit 4006 includes a shift register 5002 having a plurality of stages of D-flip flops (Delayed Flip-Flops; D-FFs) 5001, a data latch circuit 5003, a latch circuit 5004, a level shifter 5005, a buffer 5006 or the like. The data latch circuit of the invention can be applied to the data latch circuit 5003 portion. The data latch circuit described in any of Embodiment Modes can be adopted. Although the description is given here on the case where the invention is applied to the data latch circuit 5003, the data latch circuit may be applied to the latch circuit 5004 as well.

Signals to be input are a clock signal line (S-CK), an inverted clock signal line (S-CKB), a start pulse (S-SP), a digital video signal (DATA), and a latch pulse (Latch Pulse). As for the reference potential, an intermediate potential of an amplitude of the digital video signal is input.

First, a sampling pulse is output from the shift register 5002 in sequence according to the timing at which a clock signal, a clock inverted signal and a start pulse are input. The sampling pulse is input to the data latch circuit 5004. The data latch circuit 5004 is reset by the sampling pulse which is input from the D-FF 5001 of the preceding stage, and then samples a digital video signal at the timing at which a sampling pulse from the D-FF 5007 of the present stage is input, thereby holding it. This operation is performed from the first column in sequence.

When the holding of the digital video signal is complete in the data latch circuit 5003 of the last stage, a latch pulse is input during a horizontal fly-back period. Then, the digital video signals held in the data latch circuit 5003 are transferred to the latch circuit 5004 all at once. Subsequently, the signals are level shifted in the level shifter 5005, and then, after being adjusted by the buffer 5006, they are output to source signal lines S1 to Sn all at once. At this time, H level and L level are input to the pixels in the row selected by the gate signal line driver circuits 4007, thereby controlling light emission or non-light emission of the EL element 4011.

Although the panel 4010 and the external circuit 4004 are separately provided in the active matrix display device in this embodiment, they may be integrated over the same substrate. In addition, although organic EL is used as an example for the display device, a light emitting device using light emitting elements other than organic EL or a liquid crystal display device can be used as well. The source signal line driver circuit 4006 may be removed of the level shifter 5005 and the buffer 5006 as well.

Embodiment 2

As described in Embodiment 1, the data latch circuit of the invention can be used for various display devices, and the display devices can be used in the display portions of various electronic devices. In particular, the display device of the invention can be preferably used for mobile devices that require low power consumption.

Specific examples of the electronic devices include a mobile information device (mobile phone, mobile computer, portable game machine, an electronic book or the like), a video camera, a digital camera, a goggle type display, a display, a navigation system or the like. Specific examples of these electronic devices are shown in FIGS. 9(A) to 9(D).

Figure 9:
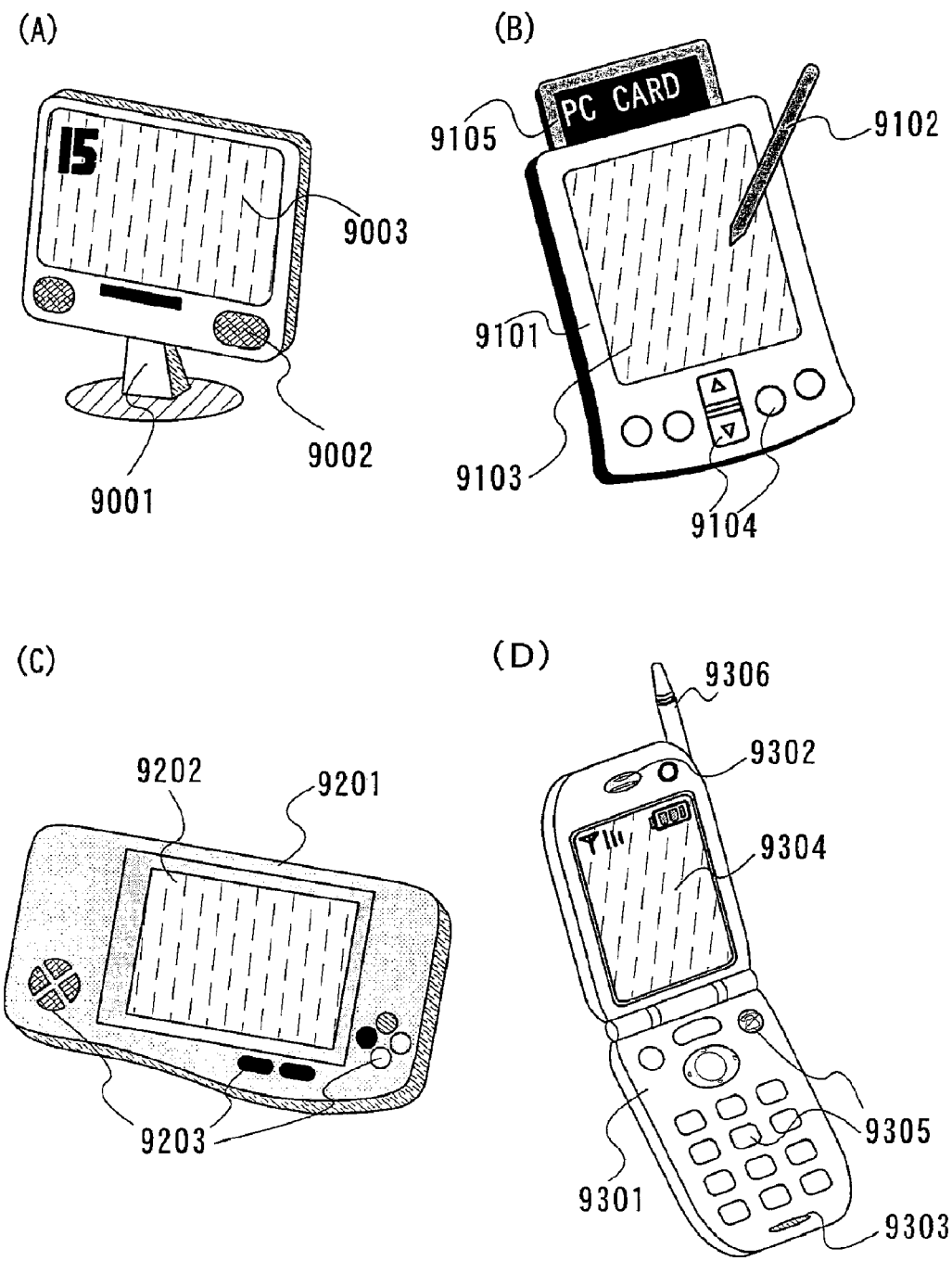
FIG. 9 are views of electronic devices to which the invention can be applied.

FIG. 9(A) is a display including a housing 9001, an audio output portion 9002, a display portion 9003 or the like. The display device using the data latch circuit of the invention can be used for the display portion 9003. The display device includes all the information display devices for a personal computer, a TV broadcasting receiver, an advertisement display or the like.

FIG. 9(B) is a mobile computer including a main body 9101, a stylus 9102, a display portion 9103, operating switches 9104, an external interface 9105 or the like. The display device using the data latch circuit of the invention can be used for the display portion 9103.

FIG. 9(C) is a game machine including a main body 9201, a display portion 9202, operating switches 9203 or the like. The display device using the data latch circuit of the invention can be used for the display portion 9202.

FIG. 9(D) is a mobile phone including a main body 9301, an audio output portion 9302, an audio input portion 9303, a display portion 9304, operating switches 9305, an antenna 9306 or the like. The display device using the data latch circuit of the invention can be used for the display portion 9304.

INDUSTRIAL APPLICABILITY

As described above, the data latch circuit of the invention can be applied to all the circuits which sample digital data, and in particular, it is suitably applied to a driver circuit of a display device. In addition, the scope of application of the display device using the data latch circuit of the invention in a portion of its driver circuit is so wide that it can be used for display devices in various fields.

What is claimed is:

1. A semiconductor device comprising:
    a pixel portion; and
    a source signal line driver circuit comprising a flip flop, a data latch circuit, a latch circuit, a level shifter and a buffer, the data latch circuit comprising:
        a capacitor;
        an inverter;
        a first transistor;
    a second transistor;
    a third transistor;
        a first wiring; and
        a second wiring,
    wherein an input terminal of the inverter is electrically connected to a first electrode of the capacitor,
    wherein one of a source and a drain of the first transistor is electrically connected to the input terminal of the inverter,
    wherein the other of the source and the drain of the first transistor is electrically connected to an output terminal of the inverter,
    wherein one of a source and a drain of the second transistor is electrically connected to a second electrode of the capacitor, wherein one of a source and a drain of the third transistor is electrically connected to the second electrode of the capacitor, wherein the other of the source and the drain of the second transistor is electrically connected to the first wiring, wherein the other of the source and the drain of the third transistor is electrically connected to the second wiring, wherein the first wiring is supplied with a reference potential, wherein the second wiring is supplied with a video signal, and wherein the pixel portion and the source signal line driver circuit are formed on a same substrate.

2. The semiconductor device according to claim 1, wherein the first transistor comprises polysilicon.

3. A semiconductor device comprising:

a pixel portion; and a first circuit comprising a flip flop, a second circuit, a latch circuit, a level shifter and a buffer, the second circuit comprising:
a capacitor;
an inverter;
a first transistor;
a second transistor;
a third transistor;
a first wiring; and
a second wiring, wherein an input terminal of the inverter is electrically connected to a first electrode of the capacitor, wherein one of a source and a drain of the first transistor is electrically connected to the input terminal of the inverter, wherein the other of the source and the drain of the first transistor is electrically connected to an output terminal of the inverter, wherein one of a source and a drain of the second transistor is electrically connected to a second electrode of the capacitor, wherein one of a source and a drain of the third transistor is electrically connected to the second electrode of the capacitor, wherein the other of the source and the drain of the second transistor is electrically connected to the first wiring, wherein the other of the source and the drain of the third transistor is electrically connected to the second wiring, wherein the first wiring is supplied with a reference potential, wherein the second wiring is supplied with a video signal, and wherein the pixel portion and the first circuit are formed on a same substrate.

4. The semiconductor device according to claim 3, wherein the first circuit is configured to drive the pixel portion.

5. The semiconductor device according to claim 3, wherein the second circuit is a data latch circuit.

6. The semiconductor device according to claim 3, wherein the flip flop is operationally connected to the second circuit.

7. The semiconductor device according to claim 3, wherein the second circuit is operationally connected to the latch circuit.

8. The semiconductor device according to claim 3, wherein the latch circuit is operationally connected to the level shifter.

9. The semiconductor device according to claim 3, wherein the level shifter is operationally connected to the buffer.

10. The semiconductor device according to claim 3, wherein the first transistor comprises polysilicon.

11. A semiconductor device comprising:

a pixel portion; and a first circuit comprising a flip flop and a second circuit, the second circuit comprising:
a capacitor;
an inverter;
a first transistor;
a second transistor;
a third transistor;
a first wiring; and
a second wiring, wherein an input terminal of the inverter is electrically connected to a first electrode of the capacitor, wherein one of a source and a drain of the first transistor is electrically connected to the input terminal of the inverter, wherein the other of the source and the drain of the first transistor is electrically connected to an output terminal of the inverter, wherein one of a source and a drain of the second transistor is electrically connected to a second electrode of the capacitor, wherein one of a source and a drain of the third transistor is electrically connected to the second electrode of the capacitor, wherein the other of the source and the drain of the second transistor is electrically connected to the first wiring, wherein the other of the source and the drain of the third transistor is electrically connected to the second wiring, wherein the first wiring is supplied with a reference potential, wherein the second wiring is supplied with a video signal, and wherein the pixel portion and the first circuit are formed on a same substrate.

12. The semiconductor device according to claim 11, wherein the first circuit is configured to drive the pixel portion.

13. The semiconductor device according to claim 11, wherein the second circuit is a data latch circuit.

14. The semiconductor device according to claim 11, wherein the flip flop is operationally connected to the second circuit.

15. The semiconductor device according to claim 11, wherein the first transistor comprises polysilicon.

* * * * *

UNITED STATES PATENT AND TRADEMARK OFFICE
CERTIFICATE OF CORRECTION

| | | |
|---|---|---|
| PATENT NO. | : 8,212,600 B2 | Page 1 of 1 |
| APPLICATION NO. | : 13/213483 | |
| DATED | : July 3, 2012 | |
| INVENTOR(S) | : Mitsuaki Osame | |

It is certified that error appears in the above-identified patent and that said Letters Patent is hereby corrected as shown below:

Column 2, line 20, replace "TFTS" with --TFTs--

Column 4, line 14, replace "rust" with --first--

Signed and Sealed this
Twenty-third Day of October, 2012

David J. Kappos
*Director of the United States Patent and Trademark Office*